United States Patent
Xu

(10) Patent No.: US 10,872,940 B2
(45) Date of Patent: Dec. 22, 2020

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventor: Zhengyin Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/432,223

(22) Filed: Jun. 5, 2019

(65) Prior Publication Data

US 2020/0127067 A1  Apr. 23, 2020

(30) Foreign Application Priority Data

Oct. 17, 2018 (CN) .......................... 2018 1 1211273

(51) Int. Cl.
*H01L 27/32* (2006.01)
*H01L 51/50* (2006.01)
*H01L 51/56* (2006.01)
*H01L 51/00* (2006.01)

(52) U.S. Cl.
CPC ...... *H01L 27/3246* (2013.01); *H01L 51/5056* (2013.01); *H01L 51/5072* (2013.01); *H01L 51/56* (2013.01); *H01L 51/006* (2013.01); *H01L 51/0058* (2013.01); *H01L 51/0059* (2013.01); *H01L 51/0072* (2013.01); *H01L 51/0081* (2013.01); *H01L 2227/323* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 10,361,403 B2 | 7/2019 | Langguth et al. | |
| 2012/0319089 A1* | 12/2012 | Shin | H01L 51/0017 257/40 |
| 2015/0357602 A1 | 12/2015 | Li et al. | |

(Continued)

FOREIGN PATENT DOCUMENTS

| | | |
|---|---|---|
| CN | 108172602 A | 6/2018 |
| WO | 2018108874 A1 | 6/2018 |

OTHER PUBLICATIONS

First Office Action in the priority Chinese application No. 201811211273.5 dated Mar. 10, 2020 and its English translation.

*Primary Examiner* — Khaja Ahmad
(74) *Attorney, Agent, or Firm* — Dilworth & Barrese, LLP.; Michael J. Musella, Esq.

(57) ABSTRACT

A display substrate, a manufacturing method thereof and a display device are disclosed. The method includes: forming a pixel defining layer being doped with a heat-generating material capable of generating heat under specified conditions; sequentially forming a first carrier transport layer, a light-emitting material layer and a second carrier transport layer, wherein orthographic projections of the first and second carrier transport layers and the pixel defining layer on the base substrate have an overlapping region; controlling the heat-generating material to generate heat under specified conditions, and allowing a material of the first carrier transport layer to mix with a material of the second carrier transport layer in the overlapping region.

11 Claims, 4 Drawing Sheets

(56) References Cited

U.S. PATENT DOCUMENTS

| | | | |
|---|---|---|---|
| 2016/0155785 A1* | 6/2016 | Sato | H01L 27/3246 257/40 |
| 2017/0040397 A1* | 2/2017 | Choe | H01L 27/3211 |
| 2017/0194396 A1* | 7/2017 | Choe | H01L 51/5088 |
| 2018/0375052 A1* | 12/2018 | Yang | H01L 51/5036 |
| 2019/0006445 A1* | 1/2019 | Seok | H01L 27/3211 |
| 2019/0206946 A1 | 7/2019 | Xu et al. | |

\* cited by examiner

DISPLAY SUBSTRATE, MANUFACTURING METHOD THEREOF, AND DISPLAY DEVICE

TECHNICAL FIELD

The embodiments of invention relate to a display substrate, a manufacturing method thereof and a display device.

BACKGROUND

An Organic Light-emitting Diode (OLED) display substrate may include an anode layer, a hole transport layer, a light-emitting layer, an electron transport layer, a cathode layer, a pixel circuit, etc. disposed on a base substrate. The anode layer may include an anode disposed in each pixel region, and the light-emitting layer may include a sub-light-emitting layer disposed in each pixel region.

In the related art, the hole transport layer, the electron transport layer and the cathode layer are all of a whole layer structure. By applying voltage to the cathode layer and the anode, an electric field is generated between the cathode layer and the anode, and the cathode layer injects electrons into the electron transport layer, while the anode injects holes into the hole transport layer. After the electron passes through the electron transport layer and the hole passes through the hole transport layer, under the action of electric field force, the electron and the hole can move towards the sub-light-emitting layer, so that the hole and the electron meet and combine in the sub-light-emitting layer, and the energy released in the combining process can excite the chemical molecules in the sub-light-emitting layer to emit light.

However, since the hole transport layer is a whole layer structure, holes may move along the hole transport layer, resulting in current crosstalk between different pixel regions, affecting the display effect of the display substrate.

SUMMARY

An embodiment of the disclosure provides a display substrate, a manufacturing method thereof and a display device.

In a first aspect, an embodiment of the present disclosure provides a manufacturing method of a display substrate, the method comprises: providing a base substrate; forming a pixel defining layer on the base substrate, wherein a heat-generating material is doped in the pixel defining layer, and the heat-generating material is a material capable of generate heat under a specified condition; sequentially forming a first carrier transport layer, a light-emitting material layer and a second carrier transport layer on the base substrate on which the pixel defining layer is formed, wherein an orthographic projection of the first carrier transport layer on the base substrate, an orthographic projection of the second carrier transport layer on the base substrate, and an orthographic projection of the pixel defining layer on the base substrate have an overlapping region, one of the first carrier transport layer and the second carrier transport layer is an electron transport layer, and the other is a hole transport layer; and controlling the heat-generating material to generate heat under the specified condition, and allowing a material of the first carrier transport layer to mix with a material of the second carrier transport layer in the overlapping region.

Optionally, the pixel defining layer is used to define a plurality of display regions on the base substrate, and the sequentially forming the first carrier transport layer, the light-emitting material layer and the second carrier transport layer on the base substrate on which the pixel defining layer is formed, comprises: forming the first carrier transport layer covering each of the plurality of display regions and the pixel defining layer on the base substrate on which the pixel defining layer is formed; forming the light-emitting material layer in each of the plurality of display regions defined by the pixel defining layer; forming the second carrier transport layer at least in the display region and the overlapping region, on the base substrate on which the light-emitting material layer is formed.

Optionally, the forming the second carrier transport layer at least in the display region and the overlapping region, on the base substrate on which the light-emitting material layer is formed comprises: directly forming the second carrier transport layer above the first carrier transport layer in the overlapping region, and simultaneously forming the second carrier transport layer in the display region.

Optionally, the forming the second carrier transport layer at least in the display region and the overlapping region, on the base substrate on which the light-emitting material layer is formed comprises: forming an intermediate layer on the base substrate on which the light-emitting material layer is formed; forming the second carrier transport layer at least in the display region and the overlapping region, on the base substrate on which the intermediate layer is formed.

Optionally, the heat-generating material is a light absorbing material, and the specified condition is to irradiate the light absorbing material with infrared light.

Optionally, the light absorbing material comprises vanadium pentoxide, titanium dioxide, tellurium dioxide or bismuth oxide.

Optionally, the forming the pixel defining layer on the base substrate comprises: forming a pixel defining film layer on the base substrate by using a pixel defining layer material doped with the heat-generating material; and patterning the pixel defining film layer to obtain the pixel defining layer.

Optionally, before forming the pixel defining layer on the base substrate, the method further comprises: forming a first electrode layer on the base substrate; after controlling the heat-generating material to generate heat under the specified condition, and allowing the material of the first carrier transport layer to mix with the material of the second carrier transport layer in the overlapping region, the method further comprises: forming a second electrode layer on the base substrate on which the second carrier transport layer is formed, wherein a polarity of electrical signal applied to the second electrode layer is opposite to a polarity of electrical signal applied to the first electrode layer.

Optionally, the heat-generating material is an electric heat-generating material, and the specified condition is to apply a voltage of a preset amplitude to the electric heat-generating material.

In a second aspect, an embodiment of the present disclosure provides a display substrate comprising: a pixel defining layer arranged on the base substrate, wherein a heat-generating material is doped in the pixel defining layer, and the heat-generating material is a material capable of generate heat under a specified condition; a first carrier transport layer, a light-emitting material layer and a second carrier transport layer arranged on a side of the pixel defining layer away from the base substrate, wherein an orthographic projection of the second carrier transport layer on the base substrate, and an orthographic projection of the pixel defining layer on the base substrate have an overlapping region, one of the first carrier transport layer and the second carrier transport layer is an electron transport layer, and an other is a hole transport layer; wherein each of the first carrier transport layer and the second carrier transport layer has a carrier transport region and a carrier cutoff region, the carrier cutoff region is located in the overlapping region, and a material in the carrier cutoff region is a mixed material of a material of the carrier transport region in the first carrier transport layer and a material of the carrier transport region in the second carrier transport layer.

Optionally, the pixel defining layer is used to define a plurality of display regions on the base substrate, and the light-emitting material layer is disposed in each of the plurality of display regions; the first carrier transport layer is formed in each of the plurality of display regions and on a surface of the pixel defining layer away from the base substrate; a second carrier transport layer is formed at least in each of the plurality of display regions and on a side of the first carrier transport layer away from the base substrate located in the overlapping region.

Optionally, at least one intermediate layer is further formed between the first carrier transport layer and the second carrier transport layer in the overlapping region.

Optionally, in the overlapping region, at least a portion of the first carrier transport layer is directly in contact with the second carrier transport layer.

Optionally, the display substrate further comprises a first electrode layer and a second electrode layer, the first electrode layer is located between the base substrate and the pixel defining layer, the second electrode layer is located on a side of the second carrier transport layer away from the base substrate, and a polarity of electrical signal applied to the second electrode layer is opposite to that of electrical signal applied to the first electrode layer.

Optionally, the display substrate further includes: a first carrier injection layer disposed between the first electrode layer and the first carrier transport layer; and a second carrier injection layer disposed between the second electrode layer and the second carrier transport layer.

Alternatively, the heat-generating material includes an electric heat-generating material or a light absorbing heat-generating material.

Optionally, the light absorbing and heat-generating material includes vanadium pentoxide ($V_2O_5$), titanium dioxide ($TiO_2$), tellurium dioxide ($TeO_2$), bismuth oxide ($Bi_2O_3$), titanium chloride ($TiCl_4$) or tellurium chloride ($TeCl_4$).

Optionally, the hole transport material is NPB or TPD, and the thickness of the hole transport layer ranges from 50 nm to 150 nm.

Optionally, the electron transport material is BCP, Bphen or Alq3, and the thickness of the electron transport layer ranges from 20 nm to 50 nm.

In a third aspect, an embodiment of the present disclosure provides a display device including the display substrate according to the second aspect.

BRIEF DESCRIPTION OF THE DRAWINGS

In order to more clearly explain the technical scheme in the embodiment of the present disclosure, the following will briefly introduce the drawings needed in the embodiment description. Obviously, the drawings in the following description are only some embodiments of the present disclosure. For those of ordinary skill in the art, other drawings can be obtained according to these drawings without creative labor.

DETAILED DESCRIPTION

Figure 1:
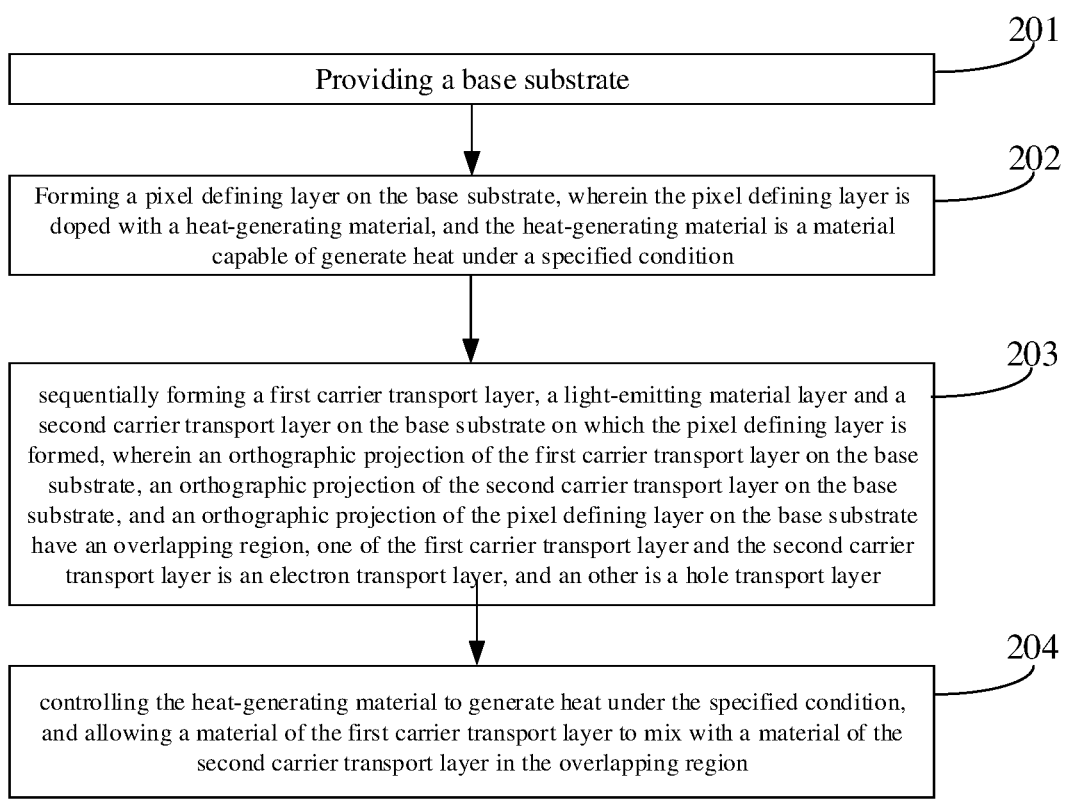
FIG. 1 is a flowchart of a manufacturing method of a display substrate provided by an embodiment of the present disclosure.

Hereinafter, embodiments of the present invention will be described in detail, examples of which are illustrated in the accompanying drawings, wherein the same or similar reference numerals refer to the same or similar elements or elements having the same or similar functions throughout. The embodiments described below with reference to the accompanying drawings are exemplary and are only for the purpose of explaining the present invention and should not be construed as limiting the present invention.

In the description of this specification, the description referring to the terms "one embodiment," "some embodiments," "examples," "specific examples," or "some examples" and the like means that a specific feature, structure, material, or characteristic described in connection with the embodiment or example is included in at least one embodiment or example of the present invention. In this specification, the schematic representation of the above-mentioned terms does not necessarily refer to the same embodiment or example. Moreover, the specific features, structures, materials, or characteristics described may be combined in any one or more embodiments or examples in a suitable manner. In addition, those skilled in the art can combine and combine different embodiments or examples described in this specification and features of different embodiments or examples without contradicting each other.

Furthermore, the terms "first" and "second" are used for descriptive purposes only and cannot be understood as indicating or implying relative importance or implicitly indicating the number of technical features indicated. Thus, features defining "first" and "second" may explicitly or implicitly include at least one of the features. In the description of the present invention, the meaning of "a plurality of" is two or more, unless otherwise specifically defined.

In order to make the objects, technical schemes and advantages of the present disclosure more clear, the embodiments of the present disclosure will be described in further detail below with reference to the accompanying drawings.

FIG. 1 is a flowchart of a manufacturing method of a display substrate provided by an embodiment of the present disclosure. Referring to FIG. 1, the method may include:

Step 201: providing a base substrate.

Step 202: forming a pixel defining layer on the base substrate, and the pixel defining layer is doped with a heat-generating material, the heat-generating material is a material capable of generating heat under specific conditions.

The pixel defining layer is used for defining a plurality of display regions arranged in an array on the base substrate, and each display region and a peripheral region of the display region forms one pixel region. That is, the pixel defining layer is located in a non-display region of a plurality of pixel regions on the base substrate.

In step 203, sequentially forming a first carrier transport layer, a light-emitting material layer and a second carrier transport layer on the base substrate on which the pixel defining layer is formed, an orthographic projection of the first carrier transport layer on the base substrate, an orthographic projection of the second carrier transport layer on the base substrate, and an orthographic projection of the pixel defining layer on the base substrate have an overlapping region.

The first carrier transport layer may be a hole transport layer and the second carrier transport layer may be an electron transport layer. Alternatively, the first carrier transport layer may be an electron transport layer and the second carrier transport layer may be a hole transport layer. Moreover, since the pixel defining layer is located in the non-display region of the plurality of pixel regions, it can be determined that the overlapping region is located in the non-display region.

Step 204: controlling the heat-generating material to generate heat under specified conditions and mix materials of the first carrier transport layer and the second carrier transport layer in the overlapping region.

By controlling the light-emitting material to generate heat under specified conditions, the heat emitted by the light-emitting material can raise temperatures of the first carrier transport layer and the second carrier transport layer located in the overlapping region, and when the temperatures of the first carrier transport layer and the second carrier transport layer reach a temperature threshold, a manufacturing material of the first carrier transport layer and a manufacturing material of the second carrier transport layer can be mixed. And according to the material property of the mixed material, the mixed material cannot provide a transmission medium for holes, so that the transmission path of holes in the overlapping region is damaged.

To sum up, the manufacturing method of the display substrate provided by the embodiment of the present disclosure controls the heat-generating material to generate heat under a specified condition, so that the manufacturing material in the first carrier transport layer and the manufacturing material in the second carrier transport layer are heated and mixed in an overlapping region. Since the mixed material cannot provide a transmission medium for holes, the transmission path of holes in the overlapping region is damaged, and the overlapping region is located in a non-display region of a pixel region. The probability that holes are transmitted between different pixel regions is reduced or even eliminated, the probability that current crosstalk is generated between different pixel regions is reduced, and the display effect of the display substrate is ensured.

Current crosstalk refers to holes in a pixel region moving into adjacent pixel regions along a hole transport layer located in a non-display region, so that electrons in the adjacent pixel regions and the holes meet and combine in a light-emitting material layer in the adjacent pixel region. When current crosstalk occurs between different pixel regions, the energy released in the process of combining electrons and holes will excite the chemical molecules in the light-emitting material layer to emit light, causing the light-emitting conditions of the light-emitting material layer in the adjacent pixel regions to be interfered, causing the display color purity of the display substrate to be lower, and affecting the display effect of the display substrate.

Optionally, the heat-generating material doped in the pixel defining layer is controlled to be under a specified condition, so that the heat-generating material can generate heat in various ways. For example, the heat-generating material may be an electric heat-generating material, and the electric heat-generating material can generate heat under the action of the voltage with the preset amplitude by loading the voltage of the preset amplitude to the electric heat-generating material. Alternatively, the heat-generating material may be a light-absorbing material, and the light-absorbing material generates heat by irradiating the base substrate on which the second carrier transport layer is formed with infrared light because the light-absorbing material can absorb the infrared light and convert light energy of the absorbed infrared light into thermal energy.

Figure 2:
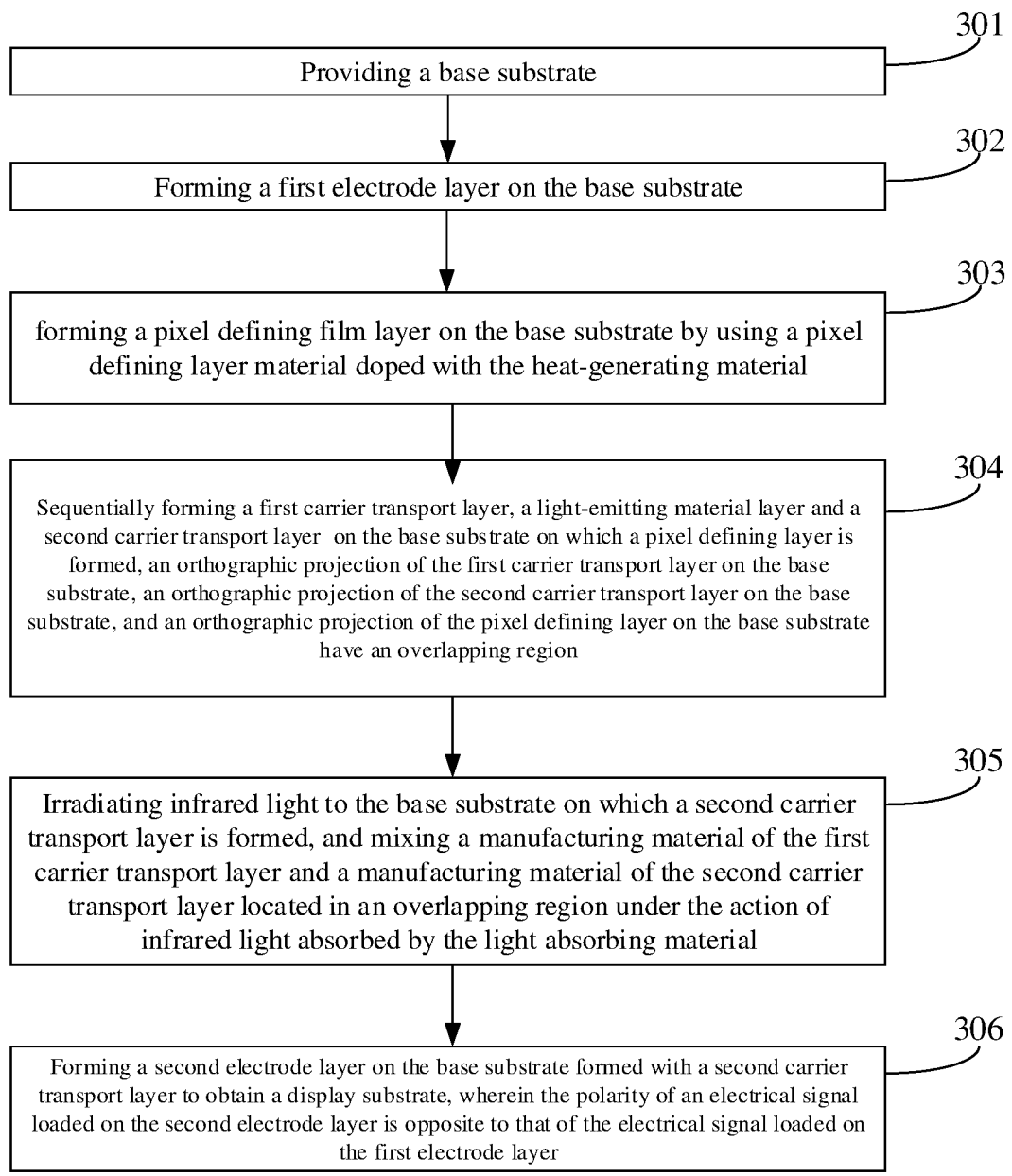
FIG. 2 is a flowchart of another manufacturing method of a display substrate provided by an embodiment of the present disclosure.

FIG. 2 is a flowchart of another manufacturing method of a display substrate provided by an embodiment of the present disclosure. In the embodiment of the present disclosure, by taking a case that a heat-generating material is a light-absorbing material and a base substrate on which a second carrier transmission layer is formed is irradiated with infrared light to heat the light-absorbing material as an example, the manufacturing method of the display substrate provided in the embodiment of the present disclosure is described. Referring to FIG. 2, the method may include the following steps.

Step 301: providing a base substrate.

Alternatively, the base substrate may be a transparent substrate, which may be the base substrate made of transparent and nonmetallic materials having a certain hardness such as glass, quartz, transparent resin, etc.

Step 302: forming a first electrode layer on the base substrate.

Alternatively, the first electrode layer may be an anode layer or a cathode layer. The embodiment of the present disclosure takes the first electrode layer being an anode layer as an example to explain the manufacturing process of the first electrode layer.

Figure 3:
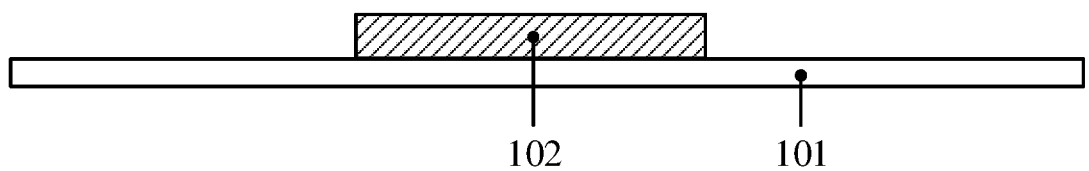
FIG. 3 is a schematic structural diagram of forming a first electrode layer on the base substrate according to an embodiment of the present disclosure.

Magnetron sputtering, thermal evaporation or plasma enhanced chemical vapor deposition (PECVD) or other methods may be used to deposit a layer of first conductive material with a certain thickness on the base substrate, to obtain a first conductive material layer, and then the first conductive material layer is processed through one patterning process to obtain the first electrode layer. With reference to FIG. 3, a schematic structural diagram after forming the first electrode layer 102 on the base substrate 101 is shown.

Alternatively, the display substrate may be a top emission type display substrate or a bottom emission type display substrate. When the display substrate is a top emission type display substrate, the first conductive material may be a transparent material or an opaque material. For example, the first conductive material may be Indium Tin Oxide (ITO) or Indium zinc oxide (IZO) and the like, or the first conductive material may be metal molybdenum (Mo), metal copper (Cu), metal aluminum (Al) or alloy materials thereof. When the display substrate is a bottom emission type display substrate, the first conductive material may be a transparent material. For example, the first conductive material may be ITO, IZO or the like.

It should be noted that before forming the first electrode layer on the base substrate, a pixel circuit layer may be formed on the base substrate, and then the first electrode layer may be formed on the base substrate on which the pixel circuit layer is formed. The pixel circuit layer may include a pixel circuit disposed in each pixel region. The first electrode layer may include a first electrode located in each pixel region, and the pixel circuit in the pixel region is used to provide a signal to the first electrode in the pixel region.

The pixel circuit may include a plurality of Thin Film Transistor (TFT) connected in a preset manner. The thin film transistor may be a top gate type thin film transistor or a bottom gate type thin film transistor. When the thin film transistor is a top gate type thin film transistor, the forming the thin film transistor may include sequentially forming an active layer, a first insulating layer, a gate electrode, a second gate insulating layer, and a source-drain electrode pattern on the base substrate. When the thin film transistor is a bottom gate type thin film transistor, the forming the thin film transistor may include sequentially forming a gate electrode, a gate insulating layer, an active layer and a source-drain electrode pattern on the base substrate.

Figure 4:
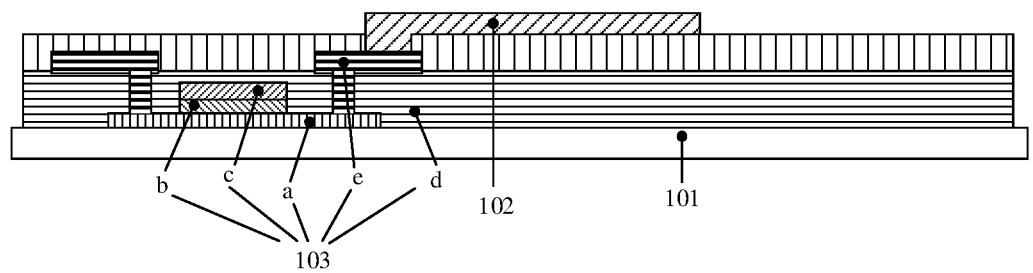
FIG. 4 is a schematic structural diagram of a structure obtained after forming a thin film transistor and a first electrode layer on the base substrate according to an embodiment of the present disclosure.

FIG. 4 shows a schematic structural diagram after forming a first electrode layer 102 on the base substrate 101 on which a thin film transistor 103 is formed according to an embodiment of the present disclosure. Referring to FIG. 4, the thin film transistor 103 is a top gate type thin film transistor, the top gate type thin film transistor includes an active layer a, a first gate insulating layer b, a gate electrode c, a second gate insulating layer d and a source drain electrode pattern e, and the thin film transistor 103 provides signals to the first electrode through the source drain pattern electrode e.

Step 303: forming a pixel defining layer on the base substrate on which the first electrode layer is formed by using a pixel defining layer material doped with a light absorbing material.

Figure 5:
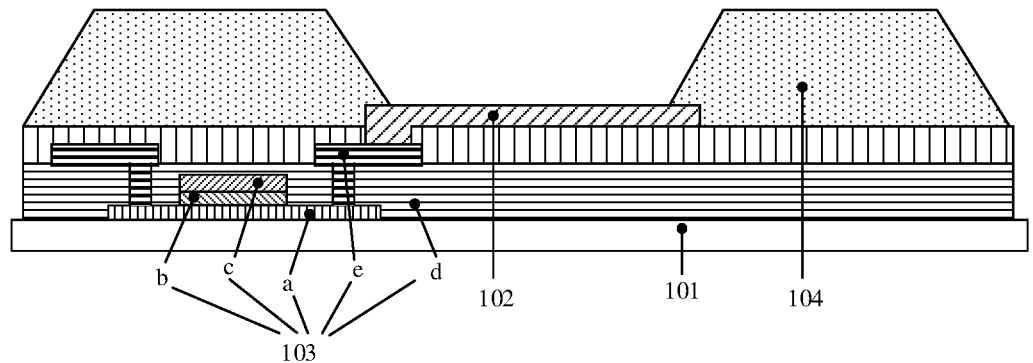
FIG. 5 is a schematic structural diagram of a structure obtained after forming a thin film transistor, a first electrode layer and a pixel defining layer on the base substrate according to an embodiment of the present disclosure.

A layer of pixel defining layer material doped with the light absorbing material with a certain thickness may be formed on the base substrate on which the first electrode layer is formed by means of coating, ink jet printing, spin coating or screen printing, to obtain a pixel defining film layer. Then, the pixel defining film layer is patterned by one patterning process to obtain the pixel defining layer. A schematic structural diagram of a structure obtained after forming the thin film transistor 103, the first electrode layer 102 and the pixel defining layer 104 on the base substrate 101 is shown in FIG. 5.

Alternatively, the pixel defining layer material may be a photoresist material doped with a light absorbing material. For example, the pixel defining layer material may be Polyimide (PI) or other polymers doped with a light absorbing material. A thickness of the pixel defining layer may be determined according to actual needs. For example, the thickness of the pixel defining layer may range from 1.5 microns to 3 microns. The light absorbing material may be a metal compound. Illustratively, the metal compound may be a compound of a metal such as tellurium, vanadium, titanium, bismuth, etc. For example, the light absorbing material may be vanadium pentoxide ($V_2O_5$), titanium dioxide ($TiO_2$), tellurium dioxide ($TeO_2$), bismuth oxide ($Bi_2O_3$), titanium chloride ($TiCl_4$), tellurium chloride ($TeCl_4$) or the like.

A particle diameter of the metal compound may range from 100 nm to 1000 nm. When the particle diameter of the metal compound is less than 1000 nanometers and the thickness range of the pixel defining layer is 1.5 microns to 3 microns, the flatness of the surface of the pixel defining layer can be prevented from being affected due to the overlarge particle diameter of the metal compound. Moreover, the concentration of the metal compound may range from 5% by weight (wt) to 10% by weight.

Optionally, in order to ensure the mixing effect of the manufacturing material of the first carrier transport layer and the manufacturing material of the second carrier transport layer, the light absorption coefficient of the pixel defining layer material doped with the light absorption material may be greater than a preset threshold. The preset threshold may be determined according to actual needs, for example, the preset threshold may be 2/mm. The expression of the light absorption coefficient of the pixel defining layer material may be:

$$\beta = -\log_{10}[T/(1-R)^2]/t,$$

where $\beta$ is the light absorption coefficient of the pixel defining layer material, t is the ratio of the light intensity after the light is transmitted through the pixel defining layer and the light intensity before the light is transmitted through the pixel defining layer, R is the reflectivity of the pixel defining layer, and t is the thickness of the pixel defining layer.

In step 304, sequentially forming a first carrier transport layer, a light-emitting material layer and a second carrier transport layer on the base substrate on which the pixel defining layer is formed, an orthographic projection of the first carrier transport layer on the base substrate, an orthographic projection of the second carrier transport layer on the base substrate, and an orthographic projection of the pixel defining layer on the base substrate have an overlapping region.

Alternatively, when the first electrode layer is an anode layer, the first carrier transport layer may be a hole transport layer and the second carrier transport layer may be an electron transport layer. Alternatively, when the first electrode layer is a cathode layer, the first carrier transport layer may be an electron transport layer and the second carrier transport layer may be a hole transport layer. In an embodiment of the present disclosure, by taking a case that the first carrier transport layer is the hole transport layer and the second carrier transport layer is the electron transport layer as an example, the manufacturing processes of the first carrier transport layer and the second carrier transport layer are illustrated.

A vapor deposition process or a solution process may be adopted to deposit a layer of hole transport material with a certain thickness on the base substrate on which the pixel defining layer is formed, to obtain a hole transport layer covering each display region and the pixel defining layer. The hole transport material and a he thickness of the hole transport layer may be determined according to actual needs. Illustratively, the hole transporting material may include triphenylamine derivative. For example, the hole transport material may be NPB (one kind of triphenylamine derivative) or TPD (another kind of triphenylamine derivative), and the thickness of the hole transport layer may range from 50 nm to 150 nm.

For example, the formula of NPB is as follows:

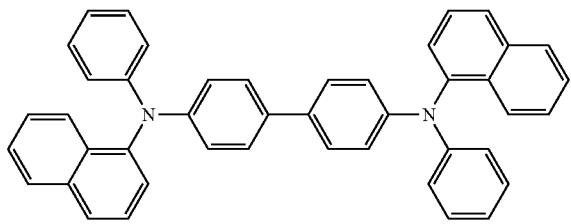 [SMILES: c1ccc(N(c2ccc(-c3ccc(N(c4ccccc4)c4cccc5ccccc45)cc3)cc2)c2cccc3ccccc23)cc1]

The molecular formula of TPD is as follows:

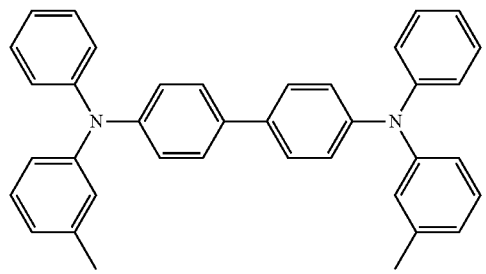 [SMILES: Cc1cccc(N(c2ccccc2)c2ccc(-c3ccc(N(c4ccccc4)c4cccc(C)c4)cc3)cc2)c1]

A vapor deposition process or a solution process may be adopted to deposit a layer of light-emitting material with a certain thickness on the base substrate on which a hole transport layer is formed, to obtain a light-emitting material film layer, and then the light-emitting material film layer is processed by one time patterning process to obtain a light-emitting material layer formed in each display region. The light-emitting material and a thickness of the light-emitting material layer may be determined according to actual needs. For example, the light-emitting material may include materials such as pyrene-containing derivative or metal iridium (Ir) complex. Illustratively, the light-emitting material may be DPAVBi (a pyrene-containing derivative), Ir(piq)$_3$ (metal iridium (Ir) complex) or Ir(ppy)$_3$ (another metal iridium (Ir) complex), etc., and the thickness of the light-emitting material layer may range from 15 nm to 16 nm.

A vapor deposition process or a solution process may be used to deposit a layer of electron transport material with a certain thickness on the base substrate on which the light-emitting material layer is formed, and a second carrier transport layer, for example, an electron transport layer, is formed at least in the display region and the overlapping region, for example, to obtain an electron transport layer covering each display region and a hole transport layer located in the overlapping region. At this time, the hole transport layer and the electron transport layer located in the overlapping region may be in direct contact in whole or in part. Alternatively, an intermediate layer may be provided between the hole transport layer and the electron transport layer located in the overlapping region, and the intermediate layer does not interfere with the mixing process caused by heat of the materials of the hole transport layer and the electron transport layer. The electron transport material and a thickness of the electron transport layer may be determined according to actual needs. The electron transport material may include nitrogen-containing fused heterocyclic derivatives, metal complexes or other materials. Illustratively, the electron transport material may be BCP (a nitrogen-containing fused heterocyclic derivative), Bphen (another nitrogen-containing fused heterocyclic derivative), Alq$_3$ (a metal complex), or the like. The thickness of the electron transport layer may range from 20 nm to 50 nm.

For example, the formula for BCP is as follows:

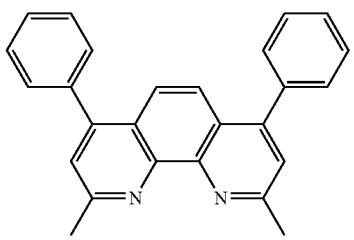 [SMILES: Cc1cc(-c2ccccc2)c2ccc3c(-c4ccccc4)cc(C)nc3c2n1]

For example, the molecular formula of Bphen is as follows:

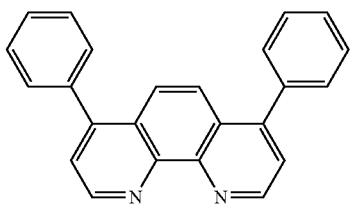 [SMILES: c1ccc(-c2ccnc3c2ccc2c(-c4ccccc4)ccnc23)cc1]

For example, the molecular formula of Alq3 is as follows:

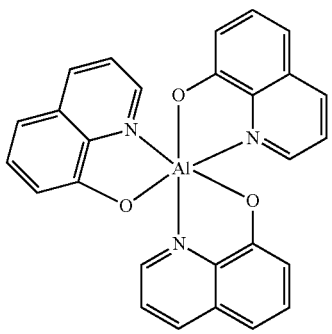

Figure 6:
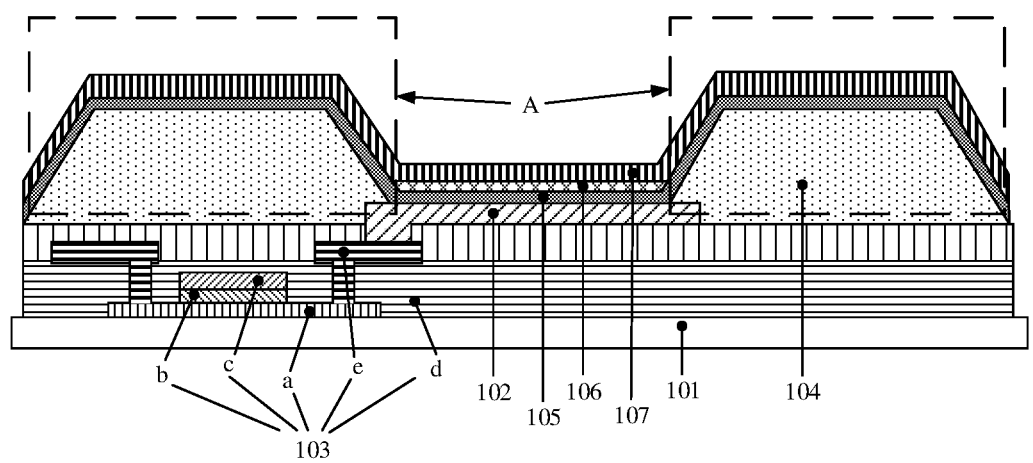
FIG. 6 is a schematic structural diagram of a structure obtained after forming a first carrier transport layer, a light-emitting material layer and a second carrier transport layer on the base substrate on which a pixel defining layer is formed according to an embodiment of the present disclosure.

FIG. 6 shows a schematic structural diagram after forming a first carrier transport layer 105, a light-emitting material layer 106 and a second carrier transport layer 107 on the base substrate 101 on which the pixel defining layer 104 is formed according to an embodiment of the present disclosure. Referring to FIG. 6, there is an overlapping region between the orthographic projection of the first carrier transport layer 105 on the base substrate 101, the orthographic projection of the second carrier transport layer 107 on the base substrate 101, and the orthographic projection of the pixel defining layer 104 on the base substrate 101. And as can be seen from FIG. 6, the overlapping region is located in the non-display region A, and the first carrier transport layer 105 and the second carrier transport layer 107 located in the non-display region A come in contact.

Step 305: irradiating infrared light to the base substrate on which the second carrier transport layer is formed, and allow the manufacturing material of the first carrier transport layer and the manufacturing material of the second carrier transport layer located in the overlapping region to mix under the action of infrared light absorbed by the light absorbing material.

The base substrate on which the second carrier transport layer is formed may be irradiated by infrared rays or infrared laser beams, etc., and the light absorbing material may convert the light energy of the absorbed infrared light into thermal energy to raise temperatures of the first carrier transport layer and the second carrier transport layer in the non-display region. When the temperatures of the first carrier transport layer and the second carrier transport layer reach the temperature threshold, the manufacturing material of the first carrier transport layer and the manufacturing material of the second carrier transport layer located in the overlapping region can be mixed so that the transmission path of holes in the overlapping region is destroyed. And because the overlapping region is located in the non-display region of the pixel region, the probability of hole transmission between different pixel regions can be reduced, the probability of current crosstalk between different pixel regions can be reduced, and the display effect of the display substrate can be ensured.

A wavelength range of the infrared light may be from 700 nm to 2.5 microns. Optionally, when irradiating infrared light to the base substrate on which the second carrier transport layer is formed, infrared light of a corresponding wavelength may be selected according to the metal compound doped in the pixel defining layer, so as to obtain a better mixing effect.

Figure 7:
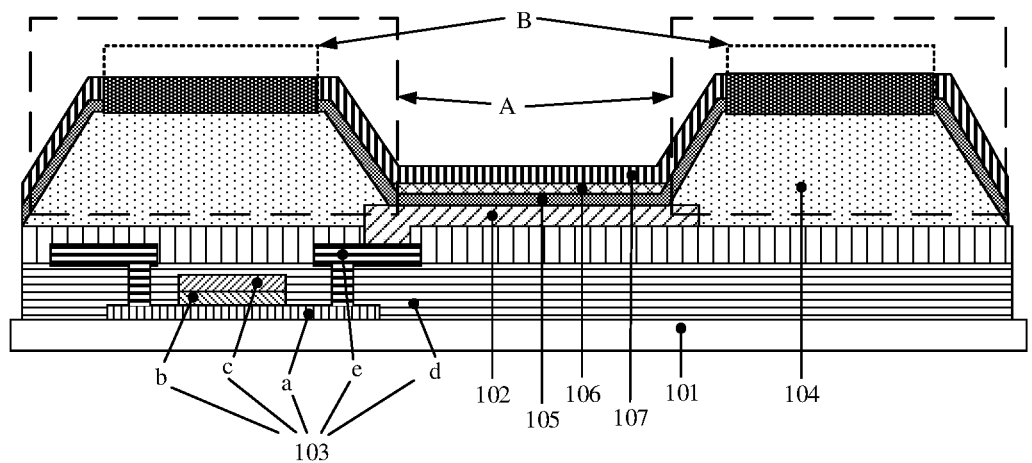
FIG. 7 is a schematic structural diagram of a structure obtained after mixing of a first carrier transport layer and a second carrier transport layer according to an embodiment of the present disclosure.

FIG. 7 shows a schematic structural diagram of a structure obtained the first carrier transport layer 105 and the second carrier transport layer 107 are mixed according to an embodiment of the present disclosure. Referring to FIG. 7, the manufacturing material of the first carrier transport layer 105 and the manufacturing material of the second carrier transport layer 107 are mixed in a region B. After the materials of the two are mixed, the transmission path of holes in the region B is destroyed. And since the region B is located in the non-display region A, the probability of holes being transported between different pixel regions is reduced.

It should be noted that in order to ensure the display effect of the display substrate, this step 305 may be performed in a water-oxygen isolated environment. The water-oxygen isolation environment may be a vacuum environment or a nitrogen environment. For example, before step 305 is performed, the base substrate on which the second carrier transport layer is formed may be transferred from a coating chamber to a vacuum chamber, to irradiate infrared light to the base substrate on which the second carrier transport layer is formed in the vacuum chamber, so that the manufacturing material of the first carrier transport layer in the non-display region and the manufacturing material of the second carrier transport layer in the non-display region are mixed. After the step 305 is completed, the base substrate on which the second carrier transport layer is formed is transferred from the vacuum chamber to the coating chamber, so as to complete subsequent processes such as manufacturing of other film layers in the coating chamber. Wherein, performing the step 305 in the vacuum chamber can ensure that the film layer formed on the base substrate is isolated from water and oxygen, so as to prevent the water and oxygen from affecting performance of the film layer formed on the base substrate, It should also be noted that in step 303, when the concentration range of the metal compound in the pixel defining layer is 5% wt to 10% wt, it can be ensured that heat generated after the metal compound absorbs infrared light is capable of mixing the manufacturing materials of the first carrier transport layer and the second carrier transport layer located in the overlapping region. In addition, it can be avoided that the manufacturing material of the first carrier transport layer in the display region and the manufacturing material of the second carrier transport layer in the display region are mixed due to a higher temperature of the first carrier transport layer and the second carrier transport layer in the display region, which is caused by excessive generated heat after the metal compound absorbs infrared light, and further influence on the characteristics of the first carrier transport layer and the second carrier transport layer in the display region can be avoided, so that the display effect of the display substrate is ensured. At the same time, since no light absorbing material is arranged in the display region, the film layer in the display region can be kept at a lower temperature in the process of irradiating the base substrate with infrared light, which can avoided influence on the characteristics of the first carrier transport layer and the second carrier transport layer in the display region.

Step 306: forming a second electrode layer on the base substrate on which the second carrier transport layer is formed, to obtain a display substrate. A polarity of an electrical signal loaded on the second electrode layer is opposite to that of the electrical signal loaded on the first electrode layer.

Alternatively, the second electrode layer may be a cathode layer when the first electrode layer is an anode layer; or the second electrode layer may be an anode layer when the first electrode layer is a cathode layer. The embodiment of the present disclosure takes the second electrode layer being a cathode layer as an example to explain the manufacturing process of the second electrode layer.

Figure 8:
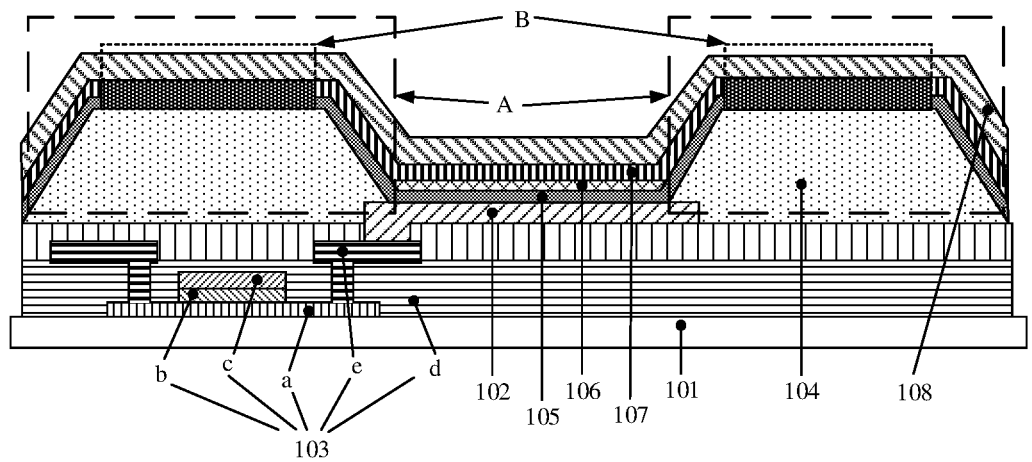
FIG. 8 is a schematic structural diagram of a structure obtained after forming a second electrode layer on the base substrate formed with a second carrier transport layer according to an embodiment of the present disclosure.

A method, such as magnetron sputtering, thermal evaporation, PECVD or the like may be adopted to deposit a layer of second conductive material with a certain thickness on the first substrate on which the second carrier transport layer is formed, to obtain a second conductive material film layer, and then the second conductive material film layer is processed through one patterning process to obtain a second electrode layer. Alternatively, the display substrate may be a top emission type display substrate or a bottom emission type display substrate. When the display substrate is a top emission type display substrate, the second conductive material may be a transparent material. For example, the second conductive material may be ITO, IZO or the like. When the display substrate is a bottom emission type display substrate, the second conductive material may be a transparent material or an opaque material. For example, the second conductive material may be ITO, IZO or the like, or the second conductive material may be Mo, Cu, Al, an alloy material thereof or the like. A schematic structural diagram of a structure obtained after forming the second electrode layer 108 on the base substrate 101 on which the second carrier transport layer 107 is formed is shown in FIG. 8.

In summary, for the manufacturing method of the display substrate provided by the embodiment of the present disclosure, infrared light is utilized to irradiate the base substrate on which the second carrier transport layer is formed, so that the light absorbing material in the pixel defining layer can convert the light energy into thermal energy after absorbing the infrared light, and the manufacturing material of the first carrier transport layer in the overlapping region and the manufacturing material of the second carrier transport layer in the non-display region are mixed due to heat under the action of the thermal energy. As the mixed material cannot provide a transmission medium for holes, the transmission path of holes in the mixed material on the overlapping region is damaged, and as the overlapping region is located in the non-display region of the pixel region, compared with the related art, the probability of holes transmitting between different pixel regions is reduced, and the probability of current crosstalk between different pixel regions is reduced. In addition, since there is no light absorbing material in the display region, the transmission path of holes in the display region will not be affected, thus ensuring the display effect of the display substrate. At the same time, the display substrate is obtained by doping a light absorbing material in the pixel defining layer and irradiating the pixel defining layer with infrared light, which has a simpler structure and a simple manufacturing process.

Figure 9:
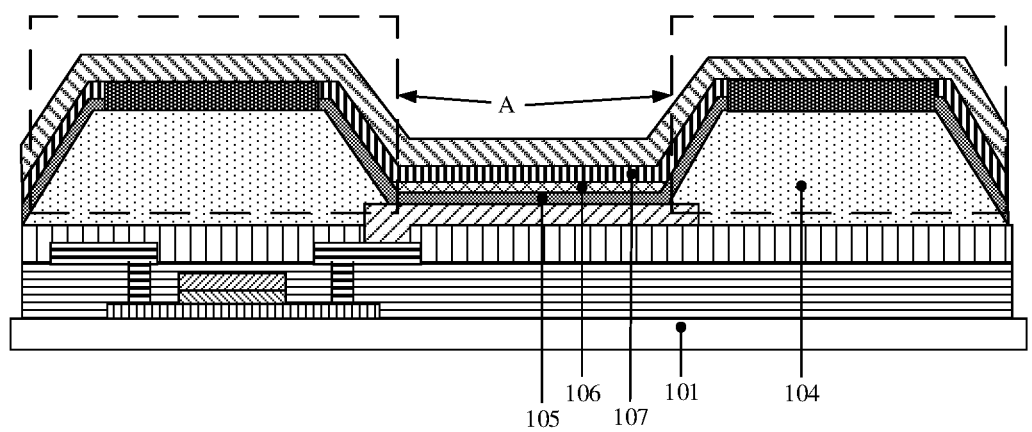
FIG. 9 is a schematic structural diagram of a display substrate provided by an embodiment of the present disclosure.

The embodiment of the present disclosure provides a display substrate, as shown in FIG. 9, the display substrate may include a pixel defining layer 104 disposed on a base substrate 101, wherein the pixel defining layer 104 is doped with a heat-generating material which is a material capable of generating heat under specified conditions. The pixel defining layer 104 is used to define a plurality of display regions arranged in an array on the base substrate 101, and each display region and a peripheral region of the display region forms one pixel region. That is, the pixel defining layer is located in the non-display region A of a plurality of pixel regions on the base substrate.

The first carrier transport layer 105, the light-emitting material layer 106, and the second carrier transport layer 107 are disposed on a side of the pixel defining layer 104 away from the base substrate 101. Moreover, there is an overlap region between an orthographic projection of the first carrier transport layer 105 on the base substrate 101, an orthographic projection of the second carrier transport layer 107 on the base substrate 101, and an orthographic projection of the pixel defining layer 104 on the base substrate 101. Meanwhile, since the pixel defining layer 104 is disposed in the non-display region A of each pixel region, it can be determined that the overlapping region is located in the non-display region A. One of the first carrier transport layer 105 and the second carrier transport layer 107 may be an electron transport layer and the other may be a hole transport layer.

Each of the first carrier transport layer 105 and the second carrier transport layer 107 has a carrier transport region and a carrier cutoff region. The carrier cutoff region is located in the overlapping region, and a material in the carrier cutoff region is a mixed material of the material in the carrier transmission region of the first carrier transmission layer 105 and the material in the carrier transmission region of the second carrier transmission layer 107. The carrier transmission region may be a region other than the carrier cutoff region in the carrier transmission layer.

In summary, in the display substrate provided by the embodiment of the present disclosure, each carrier transport layer in the first carrier transport layer and the second carrier transport layer has a carrier cutoff region, and a material in the carrier cutoff region is a mixed material of the material in the carrier transport region of the first carrier transport layer and the material in the carrier transport region of the second carrier transport layer, since the mixed material cannot provide a transport medium for holes, so that the transmission path of holes in the carrier cutoff region is damaged; and because the carrier cutoff region is located in the overlapping region and the overlapping region is located in the non-display region of the pixel region, the probability of holes transmitting between different pixel regions is reduced or even eliminated, the probability of current crosstalk between different pixel regions is reduced, and the display effect of the display substrate is ensured.

In one realizable manner, the light-emitting material layer may be disposed in each of the display regions. The first carrier transport layer may be formed in the each display region and on a surface of the pixel defining layer away from the base substrate. The second carrier transport layer may be formed at least in each display region and at a side of the first carrier transport layer located in the overlapping region away from the base substrate. At this time, the first carrier transport layer and the second carrier transport layer located in the overlapping region may be at least partially in direct contact, that is, in full or partial direct contact, that is, the second carrier transport layer may cover a surface of the first carrier transport layer located in the overlapping region away from the base substrate. Alternatively, an intermediate layer may be provided between the first carrier transport layer and the second carrier transport layer located in the overlapping region, and the intermediate layer does not interfere with a mixing process due to heat of the materials of the first carrier transport layer and the second carrier transport layer.

Alternatively, there may be various implementations for forming the carrier cutoff region. For example, the heat-generating material doped in the pixel defining layer may be an electric heat-generating material or a light absorbing material. By applying a voltage of a preset amplitude to the electric heat-generating material, the electric heat-generating material can generate heat under the voltage of the preset amplitude, and further the manufacturing material in the first carrier transport layer and the manufacturing material in the second carrier transport layer are heated and mixed in the overlapping region to obtain the carrier cut-off region. Alternatively, by irradiating the base substrate on which the second carrier transport layer is formed with infrared light, since the light absorbing material can absorb infrared light and convert the light energy of the absorbed infrared light into thermal energy, the light absorbing material generates heat, and further the manufacturing material in the first carrier transport layer and the manufacturing material in the second carrier transport layer are heated and mixed in the overlapping region to obtain the carrier cutoff region.

As shown in FIG. 8, the display substrate may further include a first electrode layer 102 and a second electrode layer 108. The first electrode layer 102 is located between the base substrate 101 and the pixel defining layer 104, the second electrode layer 108 is located on a side of the second carrier transport layer 107 away from the base substrate 101, and a polarity of the electrical signal loaded on the second electrode layer 108 is opposite to that of the electrical signal loaded on the first electrode layer 102.

Alternatively, the first electrode layer 102 may be an anode layer and the second electrode layer 108 may be a cathode layer. Alternatively, the first electrode layer 102 may be a cathode layer and the second electrode layer 108 may be an anode layer. The display substrate may be a top emission type display substrate or a bottom emission type display substrate. When the display substrate is the top emission type display substrate, the first electrode layer 102 may be made of a transparent material or an opaque material. For example, the first electrode layer 102 may be made of ITO, IZO or the like, or the first electrode layer 102 may be made of Mo, Cu, Al, an alloy material thereof or the like. The second electrode layer 108 may be made of a transparent material. For example, the second electrode layer 108 may be made of ITO, IZO or the like. When the display substrate is a bottom emission type display substrate, the first electrode layer 102 may be made of a transparent material. For example, the first electrode layer 102 may be made of ITO, IZO, or the like. The second electrode layer 108 may be made of a transparent material or an opaque material. For example, the second electrode layer 108 may be made of ITO, IZO or the like, or the second electrode layer 108 may be made of Mo, Cu, Al, an alloy material thereof or the like.

Optionally, the display substrate further includes a first carrier injection layer disposed between the first electrode layer and the first carrier transport layer; and a second carrier injection layer disposed between the second electrode layer and the second carrier transport layer.

Further, the display substrate may further include a pixel circuit that may be disposed between the base substrate 101 and the first electrode layer 102. The pixel circuit may include a plurality of thin film transistors 103 connected in a preset manner. Each thin film transistor 103 may be a top gate type thin film transistor or a bottom gate type thin film transistor. When the thin film transistor 103 is the top gate type thin film transistor, as shown in FIG. 8, the thin film transistor 103 may include an active layer a, a first insulating layer b, a gate electrode c, a second gate insulating layer d, a source-drain electrode pattern e, and the like disposed on the base substrate 101. When the thin film transistor 103 is a bottom gate type thin film transistor, the first electrode layer may include a gate electrode, a gate insulating layer, an active layer, a source-drain electrode pattern and the like disposed on a base substrate.

Moreover, when the first electrode layer 102 is an anode layer and the second electrode layer 108 is a cathode layer, the first carrier transport layer 105 may be a hole transport layer and the second carrier transport layer 107 may be an electron transport layer. Alternatively, when the first electrode layer 102 is a cathode layer and the second electrode layer 108 is an anode layer, the first carrier transport layer 105 may be an electron transport layer and the second carrier transport layer 107 may be a hole transport layer.

The hole transport layer may be made of a material such as triphenylamine derivative. By way of example, the hole transport layer may be made of a material such as NPB or TPD. And a thickness of the hole transport layer may be determined according to actual needs. For example, the thickness of the hole transport layer may range from 50 nm to 150 nm.

The light-emitting material layer 106 may be made of a material, such as, pyrene-containing derivative, metal iridium (Ir) complex and the like. By way of example, the light-emitting material layer 106 may be made of a material such as DPAVBi, Ir(piq)$_3$ or Ir(ppy)$_3$. And a thickness of the light-emitting material layer 106 may be determined according to actual needs. For example, the thickness of the light-emitting material layer 106 may range from 15 nm to 16 nm.

The electron transport layer may be made of a material such as nitrogen-containing fused heterocyclic derivative, metal complex and the like. By way of example, the electron transport layer may be made of a material such as BCP, Bphen, Alq$_3$, etc. And a thickness of the electron transport layer may be determined according to actual needs. For example, the thickness of the electron transport layer may range from 20 nm to 50 nm.

Alternatively, the pixel defining layer 104 may be made of a photoresist material doped with a light absorbing material. For example, the pixel defining material may be a polymer such as PI doped with a light absorbing material. And a thickness of the pixel defining layer 104 may be determined according to actual needs. For example, the thickness of the pixel defining layer 104 may be 1.5 microns to 3 microns.

The light absorbing material may be a compound of tellurium, vanadium, titanium, bismuth and other metals. For example, the light absorbing material may be $V_2O_5$, $TiO_2$, $TeO_2$, $Bi_2O_3$, $TiCl_4$, $TeCl_4$ or the like.

Further, in order to ensure the mixing effect of the manufacturing material of the first carrier transport layer and the manufacturing material of the second carrier transport layer, the light absorption coefficient of the pixel defining layer material doped with the light absorption material may be greater than a preset threshold. The preset threshold may be determined according to actual needs, for example, the preset threshold may be 2/mm. The expression of the light absorption coefficient of the pixel defining layer material may be:

$$\beta = -\log_{10}[T/(1-R)^2]/t,$$

where $\beta$ is the light absorption coefficient of the pixel defining layer material, t is the ratio of the light intensity after the light is transmitted through the pixel defining layer and the light intensity before the light is transmitted through the pixel defining layer, R is the reflectivity of the pixel defining layer, and t is the thickness of the pixel defining layer.

It should be noted that a particle diameter of the metal compound may range from 100 nm to 1000 nm. When the particle diameter of the metal compound is less than 1000 nanometers and the thickness of the pixel defining layer is 1.5 to 3 micrometers, the flatness of the pixel defining layer 104 can be prevented from being affected due to the large particle diameter of the metal compound.

Moreover, a concentration range of the light absorbing material in the pixel defining layer may be 5% wt to 10% wt. When the concentration of the metal compound in the pixel defining layer 104 ranges from 5% wt to 10% wt, it can be ensured that heat generated after the metal compound absorbs infrared light is capable of mixing the manufacturing materials of the first carrier transport layer and the second carrier transport layer located in the overlapping region. In addition, it can be avoided that the manufacturing material of the first carrier transport layer in the display region and the manufacturing material of the second carrier transport layer in the display region are mixed due to a higher temperature of the first carrier transport layer and the second carrier transport layer in the display region, which is caused by excessive generated heat after the metal compound absorbs infrared light, and further influence on the characteristics of the first carrier transport layer and the second carrier transport layer in the display region can be avoided, so that the display effect of the display substrate is ensured. At the same time, since no light absorbing material is arranged in the display region, the film layer in the display region can be kept at a lower temperature in the process of irradiating the base substrate with infrared light, which can avoided influence on the characteristics of the first carrier transport layer and the second carrier transport layer in the display region.

In summary, in the display substrate provided by the embodiment of the present disclosure, each carrier transport layer in the first carrier transport layer and the second carrier transport layer has a carrier cutoff region, and a material in the carrier cutoff region is a mixed material of the material in the carrier transport region of the first carrier transport layer and the material in the carrier transport region of the second carrier transport layer, since the mixed material cannot provide a transport medium for holes, so that the transmission path of holes in the carrier cutoff region is damaged; and because the carrier cutoff region is located in the overlapping region and the overlapping region is located in the non-display region of the pixel region, and as compared with the related art, the probability of holes transmitting between different pixel regions is reduced, the probability of current crosstalk between different pixel regions is reduced; moreover, since no light absorbing material exists in the display region, the transmission path of holes in the display region is not affected, the display effect of the display substrate is ensured, and the display effect of the display substrate is ensured. At the same time, the display substrate is obtained by doping a light absorbing material in the pixel defining layer and irradiating the pixel defining layer with infrared light, which has a simpler structure and a simple manufacturing process.

It should be noted that the sequence of the steps of the manufacturing method of the display substrate provided by the embodiment of the present disclosure may be adjusted appropriately, and the steps may also be increased or decreased correspondingly according to the situation. Any method that can be easily thought out by those skilled in the art familiar with the technical field within the technical scope disclosed by the present disclosure should be covered within the protection scope of the present disclosure, so it is not repeated here.

An embodiment of the present disclosure provides a display device, which may include the display substrate provided by the embodiment of the present disclosure.

Alternatively, after forming the display substrate, the formed display substrate may be packaged, cut, and assembled to form a display device. Among them, the base substrate with the second electrode layer may be encapsulated by frame glue encapsulation or face glue encapsulation to ensure the sealing performance of the display substrate.

The display device may be an OLED display substrate, a quantum dot light-emitting diode (QLED), a liquid crystal panel, an electronic paper, organic light-emitting diode panel, mobile phone, tablet computer, television, display, notebook computer, digital photo frame, navigator and other components of the device.

According to the display substrate, the manufacturing method thereof and the display device provided by the embodiment of the present disclosure, the manufacturing material of the first carrier transport layer and the manufacturing material of the second carrier transport layer are heated and mixed in an overlapping region by controlling the heat-generating material to generate heat under a specified condition; as the mixed material cannot provide a transmission medium for holes, the transmission path of the holes in the overlapping region is damaged, and the overlapping region is located in a non-display region of a pixel region. Compared with the related technology, the embodiment of the present disclosure reduces the probability of hole transmitting between different pixel regions, reduces the probability of current crosstalk between different pixel regions, and ensures the display effect of the display substrate.

For this disclosure, the following statements should be noted:

(1) The accompanying drawings involve only the structure(s) in connection with the embodiment(s) of the present disclosure, and other structure(s) can be referred to common design(s).

(2) For the sake of clarity, in the drawings used to describe embodiments of the present disclosure, the thickness of layers or regions is enlarged or reduced, i.e., these drawings are not drawn to actual scale.

(3) In case of no conflict, features in one embodiment or in different embodiments can be combined.

This application claims priority to Chinese patent application No. 201811211273.5, filed on Oct. 17, 2018, the disclosure of which is incorporated herein by reference in its entirety as part of this application.

What is claimed is:

1. A display substrate, comprising:
a pixel defining layer arranged on a base substrate, wherein a heat-generating material is doped in the pixel defining layer, and the heat-generating material is a material capable of generate heat under a specified condition;
a first carrier transport layer, a light-emitting material layer and a second carrier transport layer arranged on a side of the pixel defining layer away from the base substrate, wherein an orthographic projection of the second carrier transport layer on the base substrate, and an orthographic projection of the pixel defining layer on the base substrate have an overlapping region, one of the first carrier transport layer and the second carrier transport layer is an electron transport layer, and an other is a hole transport layer;
wherein each of the first carrier transport layer and the second carrier transport layer has a carrier transport region and a carrier cutoff region, the carrier cutoff region is located in the overlapping region, and a material in the carrier cutoff region is a mixed material of a material of the carrier transport region in the first carrier transport layer and a material of the carrier transport region in the second carrier transport layer.

2. The display substrate according to claim 1, wherein the pixel defining layer is used to define a plurality of display regions on the base substrate, and the light-emitting material layer is disposed in each of the plurality of display regions;
the first carrier transport layer is formed in each of the plurality of display regions and on a surface of the pixel defining layer away from the base substrate;
a second carrier transport layer is formed at least in each of the plurality of display regions and on a side of the first carrier transport layer away from the base substrate located in the overlapping region.

3. The display substrate according to claim 2, wherein at least one intermediate layer is further formed between the first carrier transport layer and the second carrier transport layer in the overlapping region.

4. The display substrate according to claim 2, wherein in the overlapping region, at least a portion of the first carrier transport layer is directly in contact with the second carrier transport layer.

5. The display substrate according to claim 1, wherein the display substrate further comprises a first electrode layer and a second electrode layer,
the first electrode layer is located between the base substrate and the pixel defining layer, the second electrode layer is located on a side of the second carrier transport layer away from the base substrate, and a polarity of electrical signal applied to the second electrode layer is opposite to that of electrical signal applied to the first electrode layer.

6. The display substrate according to claim 5, wherein the display substrate further comprises:
a first carrier injection layer, disposed between the first electrode layer and the first carrier transport layer; and
a second carrier injection layer, disposed between the second electrode layer and the second carrier transport layer.

7. The display substrate according to claim 1, wherein the heat-generating material comprises an electric heat-generating material or a light absorbing heat-generating material.

8. The display substrate according to claim 7, wherein the light absorbing heat-generating material comprises vanadium pentoxide ($V_2O_5$), titanium dioxide ($TiO_2$), tellurium dioxide ($TeO_2$), bismuth oxide ($Bi_2O_3$), titanium chloride ($TiCl_4$), or tellurium chloride ($TeCl_4$).

9. The display substrate according to claim 1, wherein the hole transport material is NPB or TPD, and a thickness of the hole transport layer ranges from 50 nm to 150 nm.

10. The display substrate according to claim 1, wherein the electron transport material is BCP, Bphen or Alq3, and a thickness of the electron transport layer ranges from 20 nm to 50 nm.

11. A display device comprising the display substrate according to claim 1.

\* \* \* \* \*